United States Patent
Kocan

(10) Patent No.: US 7,288,960 B2
(45) Date of Patent: Oct. 30, 2007

(54) SHARING A STATIC RANDOM-ACCESS MEMORY (SRAM) TABLE BETWEEN TWO OR MORE LOOKUP TABLES (LUTS) THAT ARE EQUIVALENT TO EACH OTHER

(75) Inventor: Fatih Kocan, Dallas, TX (US)

(73) Assignee: Southern Methodist University, Dallas, TX (US)

( * ) Notice: Subject to any disclaimer, the term of this patent is extended or adjusted under 35 U.S.C. 154(b) by 119 days.

(21) Appl. No.: 11/214,545

(22) Filed: Aug. 29, 2005

(65) Prior Publication Data

US 2007/0046324 A1 Mar. 1, 2007

(51) Int. Cl.
*G06F 7/38* (2006.01)
*H03K 19/173* (2006.01)

(52) U.S. Cl. .......................... 326/38; 326/37; 365/154

(58) Field of Classification Search ............ 326/37–39; 365/154; 708/230, 232, 235
See application file for complete search history.

(56) References Cited

U.S. PATENT DOCUMENTS

| | | | |
|---|---|---|---|
| 6,288,568 B1* | 9/2001 | Bauer et al. .................. | 326/39 |
| 7,224,182 B1* | 5/2007 | Hutchings et al. ............ | 326/38 |
| 2003/0154210 A1* | 8/2003 | Teig et al. ................... | 707/102 |
| 2005/0122132 A1* | 6/2005 | Leijten-Nowak ............. | 326/39 |

OTHER PUBLICATIONS

"Logic Modules with Shared SRAM Tables for Field-Programmable Gate Arrays" Kocan, Fatih and Meyer, Jason 14th International Conference, FPL 2004 Antwerp, Belgium Aug. 30-Sep. 1, 2004.*

Compton et al., "Reconfigurable Computing: A Survery of Systems and Software," ACM Computing Surveys, vol. 34, No. 2, pp. 171-210, 2002.

Hartenstein, "A Decade of Reconfigurable Computing: A Visionary Retrospective," in Proceedings of Design, Automation and Test in Europe, pp. 642-649, 2001.

Villasenor, W.H., "Configurable Computing," Scientific American, Jun. 1997.

Elbirt et al., "An FPGA Implementation and Performance Evaluation of the Serpent Block Chiper," in Proc. of ACM/SIGDA Int'l Symp. on FPGAs, pp. 33-40, 2000.

Hauser et al., "Garp: A MIPS Processor with a reconfigurable coprocessor," in Proce of IEEE Symp. on Field-Programmable Custom Computing Machines, pp. 12-21, 1997.

Leung et al., "FPGA Implementation of a Microcoded Elliptic Curve Cryptographic Processor," in Proc. of IEEE Symp. on Field-Programmable Custom Computing Machines, pp. 68-76, 2000.

(Continued)

*Primary Examiner*—Rexford Barnie
*Assistant Examiner*—Jason Crawford
(74) *Attorney, Agent, or Firm*—Baker Botts L.L.P.

(57) ABSTRACT

In one embodiment, a system for sharing a static random-access memory (SRAM) table between two or more lookup tables (LUTs) that are equivalent to each other includes at least two basic logic elements (BLEs) each associated with a truth table representing a particular function provided by the BLE. The particular functions provided by the BLEs including equivalency to each other. Each BLE includes an LUT including the truth table associated with the BLE. The LUTs of the BLEs share an SRAM table with each other to obviate the LUTs of the BLEs including SRAM tables separate from each other.

27 Claims, 5 Drawing Sheets

OTHER PUBLICATIONS

Borriello, "The Triptych FPGA Architecture," IEEE Trans. on VLSI Systems, vol. 3, No. 4, pp. 491-501, 1995.

Kaviani et al., "Hyprid FPGA Architecture," in Proceedings of the 1996 ACM Fourth International Symposium on Field-Programmable Gate Arrays, pp. 3-9, 1996.

Agrawal et al., "An Innovative, Segmented High Performance FPGA Family with Variable-Grain-Architecture and Widegating Functions," in Proceedings of the 1999 ACM/SIGDA Seventh International Symposium on Field Programmable Gate Arrays, pp. 17-26, 1999.

Lemieux et al., "Using Sparse Crossbars within LUT Clusters," in Proceedings of the 2001 ACM/SIGDA Ninth International Symposium on Field Programmable Gate Arrays, pp. 59-68, 2001.

Betz et al., "How Much Logic Should Go in an FPGA Logic Block?," IEEE Design and Test of Computers, vol. 15, No. 1, pp. 10-15, 1998.

Ahmed et al., "The Effect of LUT and Cluster Size on Deep-Submicron FPGA Performance and Density," in Proceedings of the 2000 ACM/DIGDA Eighth International Symposium on Field Programmable Gate Arrays, pp. 3-12, 2000.

Kimura et al., "Folding of Logic Functions and its Application to Look up Table Compaction," in Proceedings of the 2002 IEEE/ACM International Conference on Computer-Aided Design, pp. 694-697, 2002.

Kocan et al., "Logic Modules with Shared Sram Tables for Field-Programmable Gate Arrays," in Field Programmable Logic and Application, 14th International Conference, FPL 2004, Leuven, Belguim, Aug. 30, 2004-Sep. 1, 2004, Proceedings, vol. 3203 of Lecture Notes in Computer Science, pp. 289-300, Springer 2004.

Lin et al., "Universal Logic Gate for FPGA Design," in Proceedings of the 1994 IEEE/ACM International Conference on Computer-Aided Design, pp. 164-168, 1994.

XILINX, FPGA Data Book, 1996.

W. Wolf, FPGA-Based System Design, Prentice Hall, 2004.

Betz et al, "A New Packing, Placement and Routing Tool for FPGA Research," In Field-Programmable Logic and Applications, pp. 213-222, Springer-Verlag, Berlin, 1997.

* cited by examiner

*FIG. 9*
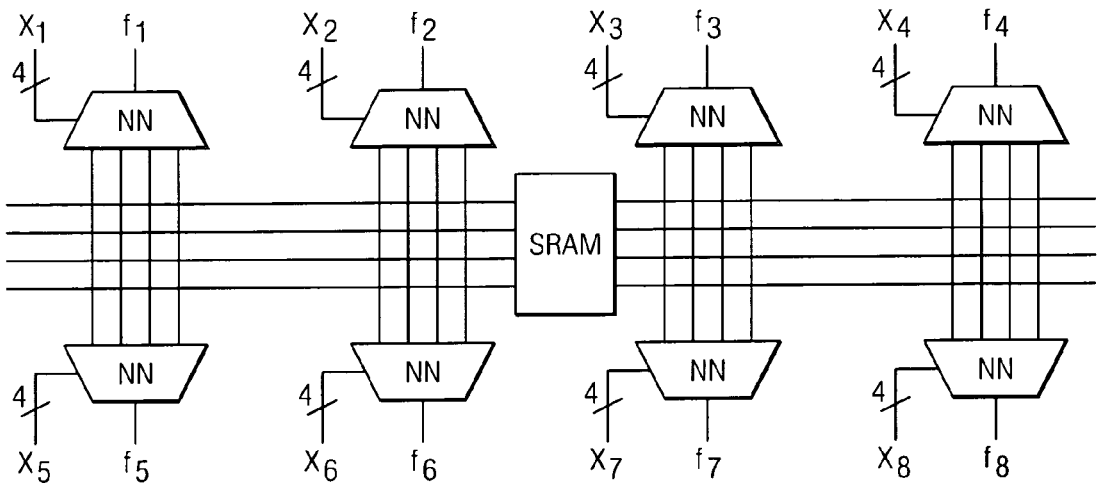
*FIG. 10*
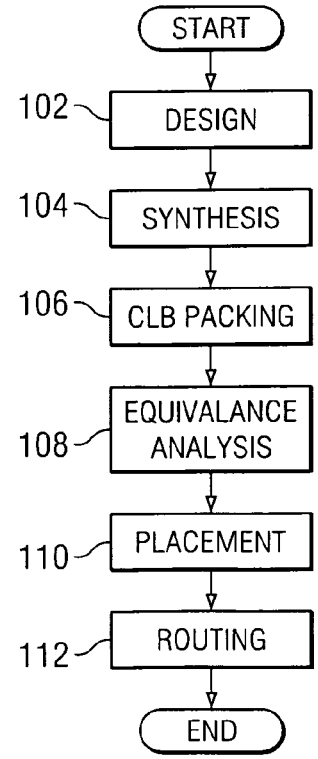
*FIG. 11*

SHARING A STATIC RANDOM-ACCESS MEMORY (SRAM) TABLE BETWEEN TWO OR MORE LOOKUP TABLES (LUTS) THAT ARE EQUIVALENT TO EACH OTHER

TECHNICAL FIELD OF THE INVENTION

This invention relates in general to reconfigurable computing and more particularly to sharing a static random-access memory (SRAM) table between two or more lookup tables (LUTs) that are equivalent to each other.

BACKGROUND OF THE INVENTION

Reconfigurable computing has emerged to bridge general-purpose computing paradigms to application-specific computing paradigms. Reconfigurable computing is typically more flexible than application-specific computing and significantly faster than general-purpose computing, as demonstrated in multiple application domains, including data encryption and cryptography. Field-programmable gate arrays (FPGAs) are building blocks of reconfigurable-computing systems.

SUMMARY OF THE INVENTION

Particular embodiments of the present invention may reduce or eliminate problems and disadvantages associated with previous reconfigurable-computing systems.

In one embodiment, a system for sharing an SRAM table between two or more LUTs that are equivalent to each other includes at least two basic logic elements (BLEs) each associated with a truth table representing a particular function provided by the BLE. The particular functions provided by the BLEs including equivalency to each other. Each BLE includes an LUT including the truth table associated with the BLE. The LUTs of the BLEs share an SRAM table with each other to obviate the LUTs of the BLEs including SRAM tables separate from each other.

Particular embodiments of the present invention may provide one or more technical advantages. As an example, particular embodiments reduce sizes of memory tables by sharing SRAM tables among multiple equivalent functions. Particular embodiments provide an FPGA architecture that enables a percentage of configurable logic blocks (CLBs) in an FPGA to allow sharing of one or more SRAM tables. In particular embodiments, locations of CLBs in an FPGA that allow sharing of one or more SRAM tables are prespecified. Particular embodiments provide a simulated annealing-based placement algorithm that places only basic logic elements (BLEs) with equivalent LUTs into predetermined CLBs that allowing sharing of SRAM tables, which often results in a higher percentage of CLBs sharing SRAM tables.

Particular embodiments provide an FPGA architecture according to which certain percentages of CLBs allow sharing of SRAM tables among P equivalent functions. Particular embodiments provide an FPGA architecture according to which certain percentages of CLBs allow sharing of SRAM tables among PN equivalent functions. Particular embodiments provide an FPGA architecture according to which certain percentages of CLBs allow sharing of SRAM tables among NP equivalent functions. Particular embodiments provide an FPGA architecture according to which certain percentages of CLBs allow sharing of SRAM tables among NPN equivalent functions. Particular embodiments provide a synthesis algorithm that substantially maximizes the number of NPN equivalent LUTs in LUT-level circuits. Particular embodiments provide one or more FPGA placement methods for minimizing or reducing usage of sharing CLBs on a critical path.

Particular embodiments may provide all, some, or none of these technical advantages. Particular embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and features and advantages thereof, reference is made to the following description, taken in conjunction with the accompanying drawings, in which:

FIG. 9 illustrates example sharing of an SRAM table among more than two LUTs;
FIG. 10 illustrates an example pattern of sharing and nonsharing BLEs in an FPGA;
and
FIG. 11 illustrates an example computer-assisted design (CAD) flow for sharing an SRAM table among two or more LUTs that are equivalent to each other.

DESCRIPTION OF EXAMPLE EMBODIMENTS

Figure 1:
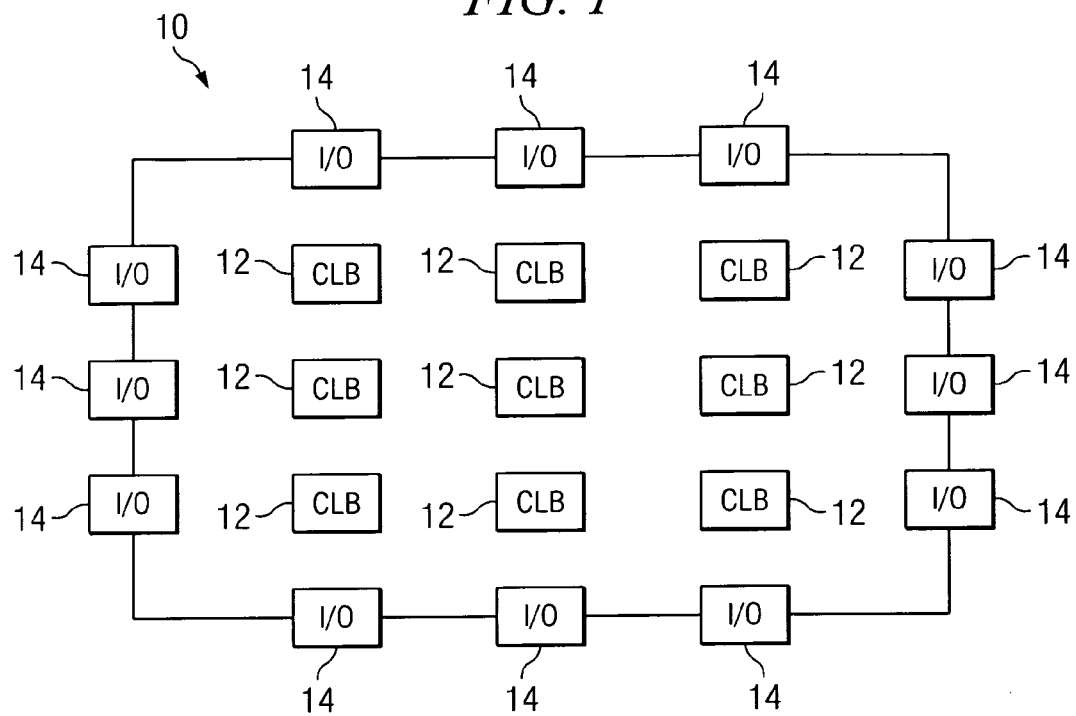
FIG. 1 illustrates an example FPGA.

FIG. 1 illustrates an example FPGA 10. FPGA 10 includes a two dimensional array of CLBs 12. A CLB 12 is a logic block that includes one or more BLEs 16, where truth tables of functions are stored using one or more static random-access memory (SRAM) tables, as described below. FPGA 10 also includes modules 14 that each facilitate communication of input to FPGA 10, communication of output from FPGA 10, or both. In particular embodiments, one or more wires and one or more switches in FPGA 10 couple CLBs 12 and modules 14 to each other. Although a particular FPGA 10 including particular numbers of particular components coupled to each other according to a particular arrangement are described and illustrated, the present invention contemplates any suitable FPGA 10 including any suitable numbers of any suitable components coupled to each other according to any suitable arrangement.

In particular embodiments, FPGA 10 includes an architecture including one or more fine-grained logic block structures, one or more coarse-grained logic block structures, or both. In particular embodiments, FPGA 10 includes a triptych architecture allowing allocation of logic cells to logic or routing functions. In particular embodiments, FPGA 10 includes a hybrid architecture incorporating into FPGA 10 one or more complex programmable logic devices (CPLDs) that use programmable array logic (PAL), programmable logic array (PLAs), or both. Such an architecture takes advantage of the idea that some parts of circuits are better suited for lookup tables (LUTs) and other parts of circuits are better suited for product term-based structures of CPLDs. In particular embodiments, FPGA 10 includes a VF1 architecture having variable-logic granularity. As an example and not by way of limitation, such an architecture may include three levels of logic hierarchy: a configurable building block (CBB); a variable-grain block (VGB) including four CBBs, and a super-variable grain block including four VGBs.

In cluster CLBs 12, where there are many BLEs 16, the BLE inputs can be chosen from cluster inputs, coming from other clusters, or from feedback of other BLEs 16 in the cluster. Previously, these internal connections were assumed to be fully connected, where every BLE input could come from any cluster input or feedback connection. These internal cluster connections can be populating sparsely, which succeeds in lowering the area required without affecting delay. For a cluster of size N, 2N+2 inputs are sufficient, and any choice between one and eight BLEs 16 per CLB 12 is acceptable. Regarding the effect of LUT size and cluster size on the speed and logic density of FPGAs 10, for a cluster of size N with k LUTs, the number of inputs should be $$\frac{k}{2} \times (N+1).$$

A line of research has been directed toward the reduction/compaction of the amount memory used to store logic functions in CLBs 12. The sizes of memory tables, e.g., SRAM tables 30, can be reduced by the folding of logic functions: one half of a truth table is deduced from the other half using a function. SRAM-table sharing among NPN-equivalent LUTs is possible: a function becomes equivalent to another one by negating or permuting some of its inputs or negating its output, referred to as NPN equivalence. Typically, a large percentage of functions in an LUT-level circuit are NPN equivalent, which may be due to biases in the synthesis tools. Therefore, SRAM-table sharing is practical.

Universal logic blocks that would support a great majority of logic functions with minimum area have been investigated. The universal logic blocks have the capacity of implementing functions that are negated at the primary inputs, permuted at the inputs or negated at the primary outputs, referred to as NPN equivalence.

Definition 1: (NPN) Two functions $f_1$ and $f_2$ are said to be NPN equivalent if and only if there exist functions $g_1$ and $g_2$ such that $f_1$ is input negation (N) equivalent to $g_1$, $g_1$ is permutation (P) equivalent to $g_2$, and $g_2$ is output negation (N) equivalent to $f_1$. NPN($f$) represents the set of all functions which are equivalent to $f$.

Equivalency analysis can be done on the functions with the same number of literals. When the numbers of the input variables of two functions do not match, dummy variables can be added and assigned constant logic values (0 or 1) to make the functions comparable. For example, let $f(x_1,x_2,x_3)$ and $g(y_1,y_2)$ be two functions of three and two variables, respectively. In such case, $f$ and $g$ cannot be compared directly. A variable $y_3$ is added to g to obtain function $g^0(y_1,y_2,y_3)$. $f(x_1,x_2,x_3)$ and $g^0(y_1,y_2,0)$ or $f(x_1,x_2,x_3)$ and $g^0(y_1,y_2,1)$ are then analyzed for NPN equivalency.

EXAMPLE 1

Let $f(a,b,c)=a \cdot b \cdot c$ and $g(p,q)=p \cdot q$. Then $f(a,b,c) \equiv g(1,p,q)$.

SRAM-based logic blocks are universal since they can implement any function by simply loading the truth table of the function into SRAM table 30. A goal is to compact the SRAMs found in logic blocks. A function folding method has been employed to compact SRAMs found in logic blocks. This folding method works as follows. Let $f(a,b,c)$ and $g(a,b,c)$ be two logic functions whose truth tables are 00011110 and 10001001, respectively. The truth table of function $f$ is divided into two parts which are 0001 and 1110. The entire truth table of function $f$ is constructed from one part as $f=a' \cdot f(0,b,c)+a \cdot \overline{f(0,b,c)}$. Because of this relation, only half of the truth table need be kept and the other half can be derived from the first part by simply taking NOT of it. For function g, there is no such NOT relation. However, there is an OR relation with 0001 part of $f$. That is, the 1001 part of g is derived from the bit-wise logical ORing of 1000 of g and 0001 of $f$. As a result, $$g(a,b,c)=a' \cdot g(0,b,c)+a \cdot \overline{\{g(0,b,c)+f(0,b,c)\}}$$

From this relation, to realize functions $f$ and g, only halves of the truth tables of $f$ and g need to be stored. These OR and NOT folding methods reduce the memory requirement of full adders, comparators, and equality checkers. These methods eliminate some part of SRAM table 30 at the expense of addition of some extra circuitry.

A cluster configurable logic block can be used to reduce the area of a traditional cluster CLB 12, and therefore FPGA 10. In this approach, P (permutation) equivalent LUTs are identified and two P-equivalent LUTs are mapped to an SRAM table 30 in a cluster. The CLB areas are reduced by allowing an SRAM table 30 in a CLB 16 to be shared by two LUTs. A simulated annealing algorithm can be used to determine which LUTs should be shared by the SRAMs and where the CLBs 16 should be placed. A large percentage of lookup tables are typically permutation (P) equivalent. This analysis is extendable to NPN equivalence where constant assignments are allowed. The percentage of NPN-equivalent functions are significantly greater than P-equivalent ones. Particular embodiments provide a CLB 16 that allows mapping of multiple NPN-equivalent LUTs to one SRAM table 30.

Figure 2:
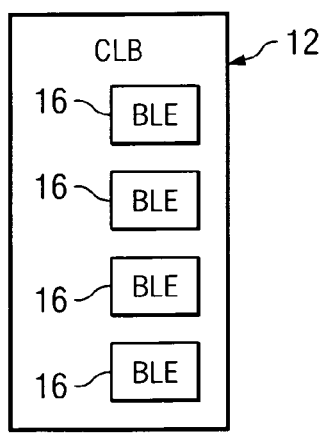
FIG. 2 illustrates an example CLB of an FPGA.
Figure 3:
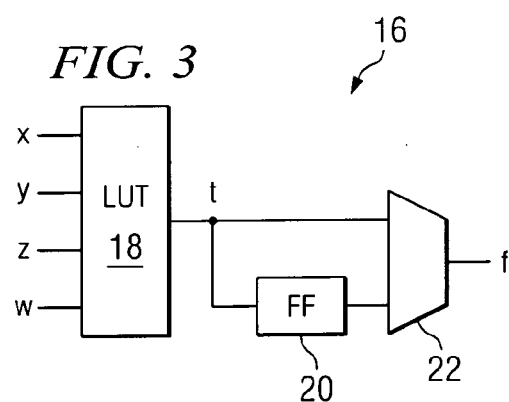
FIG. 3 illustrates an example BLE of a CLB.
Figure 4:
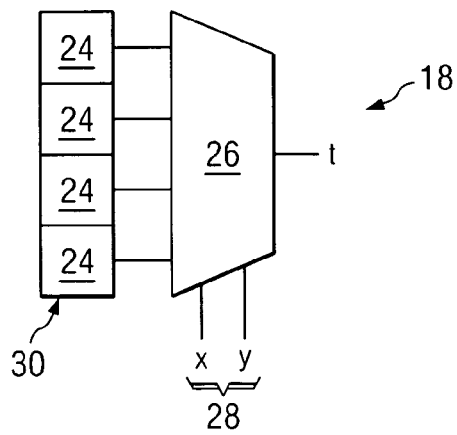
FIG. 4 illustrates an example LUT of a BLE.

FIG. 2 illustrates an example CLB 12 of an FPGA 10. CLB 12 includes four BLEs 16. Although a particular CLB 12 including a particular number of particular components is described and illustrated, the present invention contemplates any suitable CLB 12 including any suitable number of any suitable components. FIG. 3 illustrates an example BLE 16 of a CLB 12. BLE 16 is a basic logic block. BLE consists 16 of a k-input LUT 18, a flip-flop 20, and a 2×1 multiplexer 22. FIG. 4 illustrates an example LUT 18 of a BLE 16. LUT 18 has an array of SRAM cells 24 of size $2^k$ and a $2^k \times$k-size multiplexer 26 controlled by input variables 28 of the function stored in SRAM table 30. In particular embodiments, multiplexer 26 provides addressing logic for LUT 18. A cluster CLB 12 consists of an array of BLEs 16. A cluster has M inputs and N outputs and allows sharing of M inputs among the BLEs 16 as well as feeding the outputs of BLEs 16 back to the inputs of BLEs 16. A typical island-style FPGA 10 consists of an F×F array of cluster CLBs 12, with input and output pads on the periphery.

Assuming that at most K BLEs 16 are mapped to an SRAM table 30 in a CLB 12, P BLEs 16, NP BLEs 16, PN BLEs 16, and NPN BLEs 16 are defined as follows.

Definition: P, NP, PN, and NPN BLEs 16 allow the sharing of an SRAM table 30 among K P($f$), NP($f$), PN($f$), and NPN($f$), respectively.

Figure 5A:
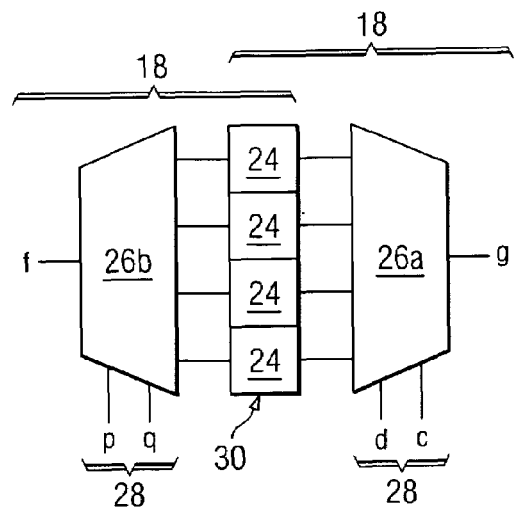
FIGS. 5A-5E illustrate example shared-LUT architectures.
Figure 5B:
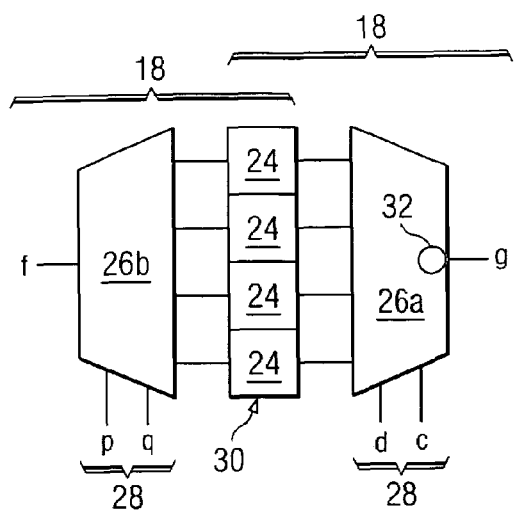
Figure 5C:
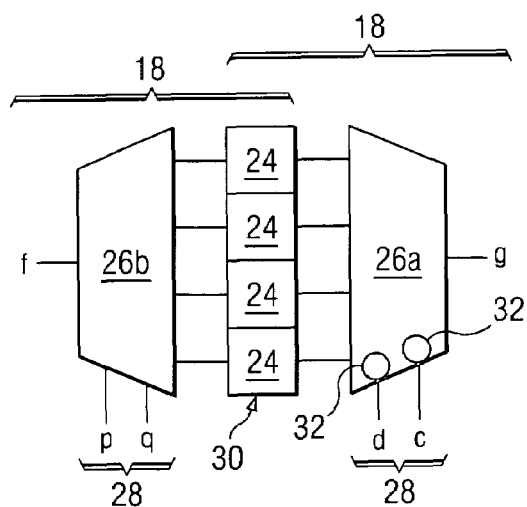

FIGS. 5A-5E illustrate example shared-LUT architectures. The architectures demonstrate configurations in which two LUTs 18 share an SRAM table 30 with each other. In FIGS. 5A-5E, a circle at an output ($f$ or g) or a control input (p, q, c, or d) of a multiplexer 26 graphically represents conditional negation (CN) logic 32. FIG. 5A illustrates an example shared-LUT architecture for P equivalent LUTs 18. Two P equivalent LUTs 18 share an SRAM table 30 without any additional logic. The inputs to LUTs 18 may be connected to inputs 28 of multiplexers 26 of LUTs 18 in a BLE 16 in any order. In a P BLE 16, the addressing logic delay through both sides are balanced. FIG. 5B illustrates an example shared-LUT architecture for PN equivalent LUTs 18. Two PN equivalent LUTs 18 share an SRAM table by adding CN logic 32 to output g of multiplexer 26a. In a PN BLE 16, the addressing logic delay would be different: multiplexer 26a with CN logic 32 is slower than multiplexer 26b. If K LUTs 18 shared an SRAM table 30 with each other, K−1 multiplexers 26 would have CN logic 32 at their outputs. FIG. 5C illustrates an example shared-LUT architecture for NP equivalent LUTs 18. Two NP equivalent LUTs 18 share an SRAM table 30 by adding CN logic 32 to control inputs d and c of multiplexer 26a. In an NP BLE 16, the addressing logic delay would be different on both sides: multiplexer 26a with CN logic 32 at its control inputs d and c is slower than multiplexer 26b. If K LUTs 18 shared an SRAM table 30 with each other, K−1 multiplexers 26 would have CN logic 32 at their control inputs.

Figure 5D:
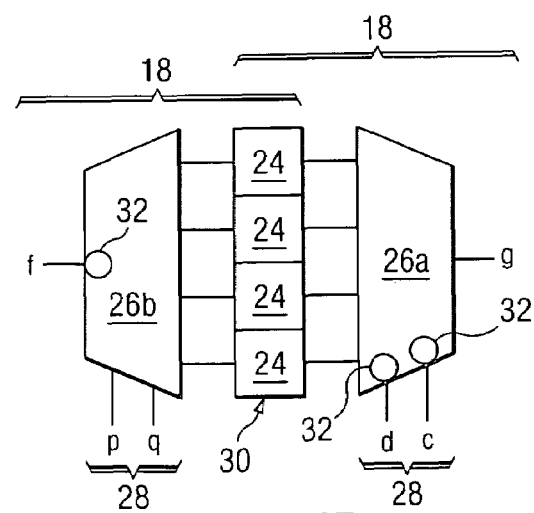
Figure 5E:
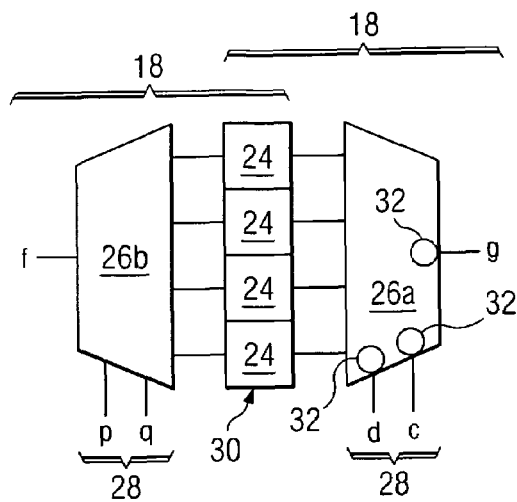

FIG. 5D illustrates an example shared-LUT architecture for NPN equivalent LUTs 18. The architecture illustrated in FIG. 5D utilizes CN logic 32 at output $f$ of multiplexer 26b and CN logic 32 at control inputs d and c of multiplexer 26a. If $f$=NPN(g), $f'$=NP(g)=PN($f$). Therefore, $f$ can be stored in SRAM table 30 and the output negated to obtain $f$. Control inputs d and c of multiplexer 26b can be conditionally negated to obtain g. If K LUTs 18 shared an SRAM table 30 with each other, K−1 multiplexers 26 would have CN logic 32 at their control inputs and one multiplexer 26 would have CN logic 32 at its output. In this version of an NPN BLE 16, the delay through both multiplexers 26 would be somewhat balanced. FIG. 5E illustrates another example shared-LUT architecture for NPN equivalent LUTs 18. The architecture illustrated in FIG. 5D utilizes CN logic 32 at control inputs d and c and output g of multiplexer 26a. If K LUTs 18 shared one SRAM table 30 with each other, K−1 multiplexers 26 would have CN logic 32 at their control inputs and outputs. In this version of an NPN BLE 16, there is a significant difference in delay through the left and right addressing logic. Multiplexers 26 are controlled by independent sets of control input variables. A carry line can be simultaneously connected to the control inputs of multiplexers 26, or an output of one multiplexer 26 can be fed back to the control inputs of another multiplexer 26.

Figure 6:
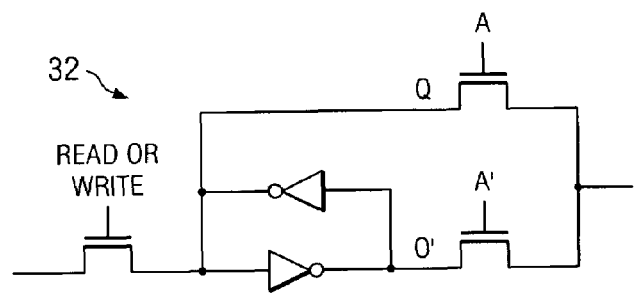
FIG. 6 illustrates example conditional negation (CN) logic.
Figure 7:
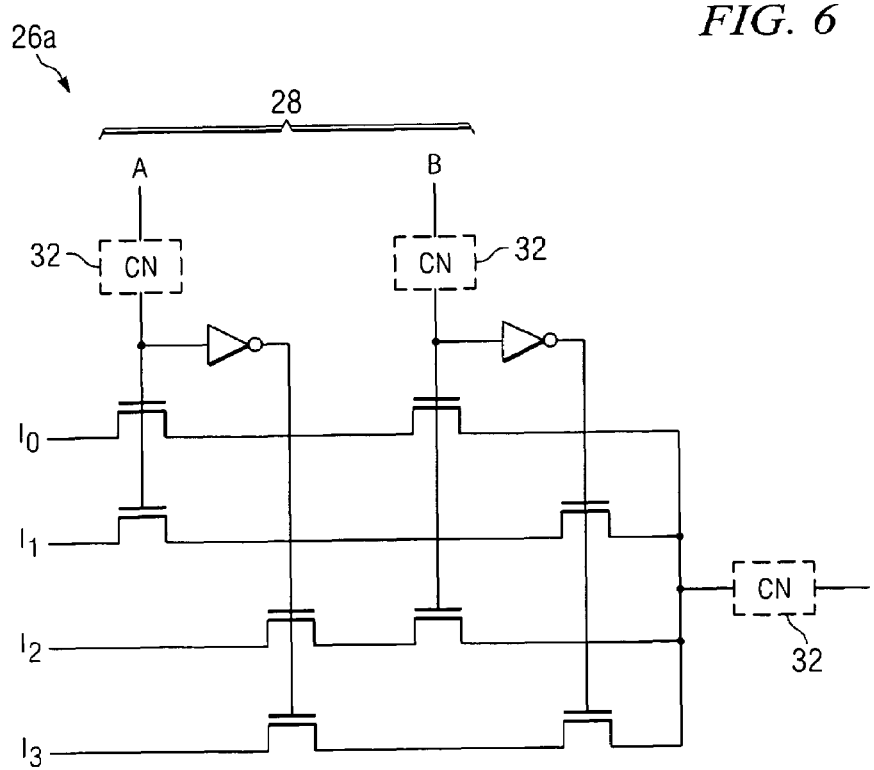
FIG. 7 illustrates an example multiplexer that provides addressing logic for an LUT and includes CN logic.
Figure 8A:
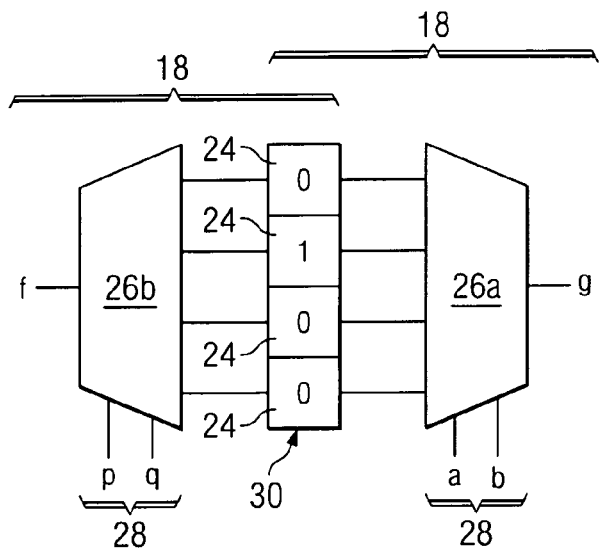
FIGS. 8A-8C illustrate example sharing of an SRAM table.
Figure 8B:
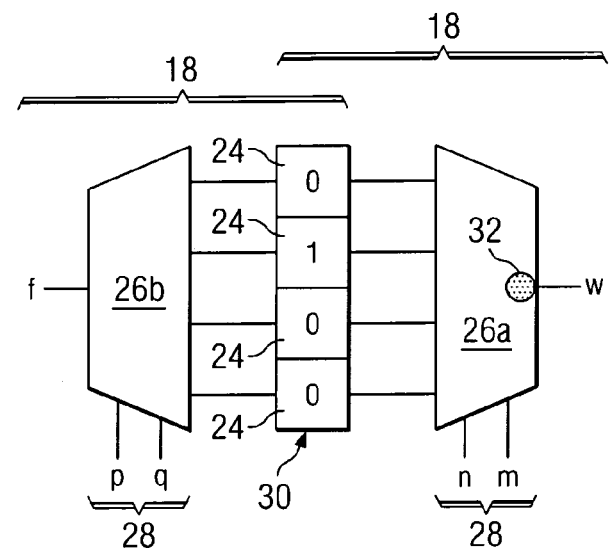
Figure 8C:
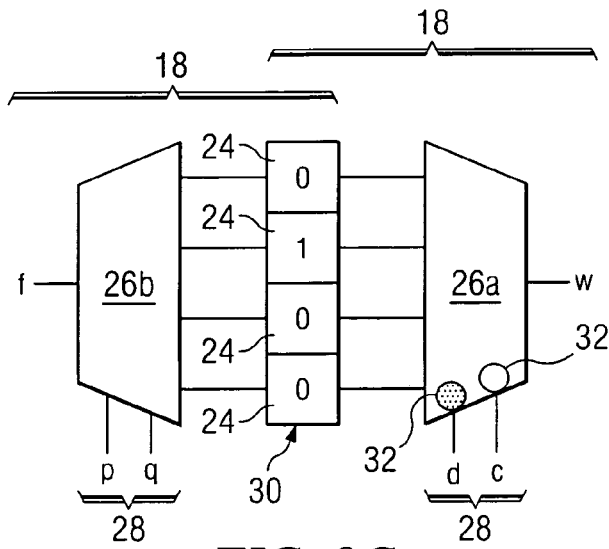

FIG. 6 illustrates example CN logic 32. In CN logic 32, out=A·Q+A'·Q', where Q is stored in a latch. If Q=0, A is negated. Otherwise, A is not negated. FIG. 7 illustrates an example implementation of multiplexer 26a illustrated in FIG. 5E. FIG. 8A illustrates P equivalent LUTs 18 sharing an SRAM table 30. FIG. 8B illustrates PN equivalent LUTs 18 sharing an SRAM table 30. FIG. 8C illustrates NP equivalent LUTs 18 sharing an SRAM table 30.

EXAMPLE 2

$f(p,q)$=p'·q and $g(a,b)$=a·b' can share an SRAM table 30 with each other. In shared SRAM table 30, the truth table of $f$ e.g., 0100, can be stored and p=y and q=x can be connected to each other (see FIG. 4). By connecting b to y and a to x, g can be realized using one SRAM table 30. FIG. 8A illustrates this case. FIGS. 8B-8C illustrate sharing of an SRAM table 30 by $f$ and $w(m,n)$=m'·n' and by $f$ and $u(c,d)$=c'·d'. In FIGS. 8A-8C, a darkened circle represents enabled CN logic 32.

Sharing an SRAM table 30 among functions with unequal numbers of variables is achievable by adding "don't care" variables together and setting the value of the "don't care" variable to either a constant 0 or a constant 1. For example, let $f(a,b,c)$=a⊙b⊙c and $g(x,y)$=xy. Since $f(0,c,b)$=bc and since $g(0,x,y)$ and $f(a,b,c)$ have identical truth tables in the first halves of their respective SRAM tables 30, functions g and $f$ can share an SRAM table 30 with each other. Constant assignments can be achieved by tying the corresponding input either to 0 or 1. If there is CN logic 32 at the inputs of a multiplexer 26 of an LUT 18, there is no need to provide both 0 and 1, since one can be obtained by the negation logic. In that case, whether to provide logic 0 or logic 1 as a constant depends on routability factors.

FIG. 9 illustrates example sharing of an SRAM table 30 among more than two P, PN, NP, or NPN equivalent LUTs 18. Like a cluster of BLEs 16, a cluster of sharing BLEs 16 (SBLEs) is a shared CLB 12 (SCLB). In a cluster CLB 12, some SRAM tables 30 can be shared and some can be used by only one BLE 16, which leads to a mixed CLB 12. For example, there could be two SRAM tables 30 in a CLB 12 including more than two BLEs 16. A first SRAM table 30 could be shared among L BLEs 16 in CLB 12, and a second SRAM table 12 could be used by only one BLE 16 in CLB 12.

Particular embodiments use a programming bit to implement part of CN logic 32. A programming bit for an SRAM-based FPGA 10 requires two inverters and one n-type transistor, a total of five transistors. Overall CN logic 32 requires seven transistors. Moreover, an SRAM cell 24 including configuration logic requires eight transistors. Let L be the degree of sharing, e.g., L LUTs 18 share one SRAM table 30 with each other and only L−1 multiplexers are annotated with CN logic 32. For a k-input LUT 18, the transistor savings per CLB 12 is given in the following equation: $CLB_{old}-CLB_{new}=(L-1)(2^{k+3}-7m)$. m is k+1, k, 1, and 0 for NPN, NP, PN, and P cases, respectively.

New CLB 12 incurs additional delays due to sharing of an SRAM cell 24 and addition of CN logic 32 on control inputs 28, output of the addressing logic, e.g., multiplexer 26, or both. The delay of an LUT 18 is dominated by the delay through the addressing logic. Similarly, in particular embodiments, the delay associated with CN logic 32 is dominated by the inverter delay τ. Assume that sharing of an LUT cell 24 incurs ε additional delay. Thus, a P BLE 16 always incurs ε delay while a PN, NP, or NPN BLE 16 would incur maximum τ+ε, τ+ε, and 2τ+ε additional delay, respectively. For a PN, NP, or NPN BLE 16, the additional minimum delay would be ε. Maximum (minimum) delay incurs when an LUT 18 is addressed by the decoder that is annotated with (without) CN logic 32.

Particular embodiments measure the impact of the sharing to the critical delay as follows. Assume that the percentage of CLBs 12 that allow sharing is p and the number of CLBs 12 on the critical path is K, then the additional delay is given in the following equations for P, NP, PN, and NPN, respectively. The additional delays are defined in ranges since an LUT 18 on the critical path may be addressed from the fast addressing logic of a sharing BLE 16.

P: $Delay_{add}$=pKε

PN: $pK\epsilon \leq Delay_{add} \leq pK(\tau+\epsilon)$

NP: $pK\epsilon \leq Delay_{add} \leq pK(\tau+\epsilon)$

NPN: $pK\epsilon \leq Delay_{add} \leq pK(2\tau+\epsilon)$

An SRAM cell 24 always consumes power. For an L=2, k=4, and NPN BLE 16 case, particular embodiments eliminate sixteen SRAM cells 24 and add at most five CN logic 32 (one configuration cell and one inverter). If it is assumed that a CN logic 32 consumes as much power as an SRAM cell 24, then particular embodiments save approximately eleven SRAM cells' 24 power.

In particular embodiments, a CLB 12 also reduces the number of configuration bits and therefore configuration time. Given the degree of sharing (L) and the number of inputs of an LUT 18 (k), P, PN, NP, and NPN save $(L-1)2^k$, $(L-1)(2^k-1)$, $(L-1)(2^k-4)$, and $(L-1)(2^k-5)$ configuration bits. Overall, assuming p percent of CLBs 12 allow sharing and there are a total of $N^2$ CLBs 12, particular embodiments save $pN^2(L-1)2^k$, $pN^2(L-1)(2^k-1)$, $pN^2(L-1)(2^k-4)$, and $pN^2(L-1)(2^k-5)$ configuration bits, respectively. For N=40, L=2, k=4, and p=¼, particular embodiments save 6400, 6000, 4800, and 4400 bits for P, PN, NP, and NPN, respectively.

Since only a certain percent of physical CLBs 12 in an FPGA 10 would allow sharing, particular embodiments fix the locations of these sharing CLBs 12. Although various patterns can be explored, for simplicity, particular embodiments assume the sharing CLBs 12 would be spaced evenly. For example, if one half of the CLBs 12 were sharing CLBs 12, the FPGA 10 would resemble a checkerboard pattern, with every other CLB 12 a sharing CLB12. In addition, for simplicity, if one out of M CLBs 12 was a sharing CLB 12, but the number of columns was not exactly divisible by N, the pattern would continue, meaning the location of the sharing CLBs 12 would not necessarily be in the same location in each row. This is illustrated in FIG. 10, where an X represents a sharing CLB 12 and a O represents a nonsharing CLB 12, where one out of four CLBs 12 is a sharing CLB 12.

In particular embodiments, an FPGA/CAD flow requires (1) a synthesis step to produce an LUT-level circuit, (2) an LUT-packing algorithm to pack LUTs 18 to CLBs 12, (3) a placement algorithm to map logical CLBs 12 to physical CLBs 12 in an FPGA 10, (4) a routing algorithm to interconnect placed CLBs 12, and (5) configuration of the device. Particular embodiments assume that a certain percentage of physical CLBs 12 of FPGAs 10 allows sharing and no mixed CLBs 12 are present. Thus, an NPN equivalence analysis is performed among LUTs 18 in a CLB 12 and only CLBs 12 with equivalent LUTs 18 are placed to sharing CLBs 12 in an FPGA 10. Nevertheless, CLBs 12 with equivalent LUTs 18 can also be put in nonsharing CLBs 12.

FIG. 11 illustrates an example computer-assisted design (CAD) flow 100. The method starts at step 102, where a design is generated. At step 104, the design is synthesized, e.g., parsed into functions (or BLEs 16) for SRAM tables 30. An equivalence analysis of LUTs 18 at step 108 follows CLB-packing at step 106. The cost of equivalence analysis is $$D^2 \binom{K}{2} NPN$$

checking where D is the dimension of an FPGA 10 and K is the number of BLEs 16 per CLB 12. For NPN equivalence, with a k-input LUT 18, there are 2k possible input negations, k! possible permutations, and two possible output negations, for a total of $2^{k+1} \cdot k!$ possibilities to check, if a brute-force approach is followed. However, particular embodiments generate equivalence lookup tables for all possible functions, including all sixteen two-input functions, all 256 three-input functions, and all 65,535 four-input functions, and any combinations of them. In particular embodiments, it is therefore trivial to do equivalence analysis using these tables—just $O(M^2)$ where M is the number of LUTs 18. After that, equivalence analysis results are provided to a modified placement algorithm at step 110, which takes into account the locations of sharing CLBs 12 in an FPGA 10. Although particular steps of CAD flow 100 are described and illustrated as occurring in a particular order, the present invention contemplates any suitable steps of CAD flow 100 occurring in any suitable order.

Particular embodiments have been used to describe the present invention, and a person having skill in the art may comprehend one or more changes, substitutions, variations, alterations, or modifications within the scope of the appended claims. The present invention encompasses all such changes, substitutions, variations, alterations, and modifications.

What is claimed is:

1. A system for sharing a static random-access memory (SRAM) table between two or more lookup tables (LUTs) that are equivalent to each other, the system comprising:
at least two basic logic elements (BLEs) each associated with a truth table representing a particular function provided by the BLE, the particular functions provided by the BLEs comprising equivalency to each other, each BLE comprising an LUT comprising the truth table associated with the BLE; and
the LUTs of the BLEs sharing an SRAM table with each other to obviate the LUTs of the BLEs comprising SRAM tables separate from each other.

2. The system of claim 1, wherein the particular functions provided by the BLEs comprise one or more of:
P equivalency to each other;
NP equivalency to each other;
PN equivalency to each other; and
NPN equivalency to each other.

3. The system of claim 1, wherein each of the BLEs comprises, in addition to the LUT:
a flip-flop; and
a multiplexer for selecting output of the LUT or output of the flip-flop to provide output of the BLE.

4. The system of claim 1, wherein each of the LUTs comprises, in addition to the SRAM table, a multiplexer coupled to the SRAM table providing addressing logic according to the truth table representing the particular function of the BLE comprising the LUT and contents of the SRAM table.

5. The system of claim 4, wherein conditional negation (CN) logic at one or more of one or more control inputs to or one or more outputs from one or more of the multiplexers of the LUTs collectively realize the equivalency of the particular functions provided by the BLEs to each other.

6. The system of claim 5, wherein the CN logic is operable to disable or enable.

7. The system of claim 1, wherein the BLEs each have four inputs and one output.

8. The system of claim 1, wherein a configurable logic block (CLB) comprises the BLEs.

9. The system of claim 8, wherein:
the CLB comprises more than two BLEs; and
one or more of the BLEs in the CLB comprise LUTs that do not share an SRAM table.

10. The system of claim 8, wherein a field-programmable gate array (FPGA) comprises the CLB.

11. The system of claim 10, wherein the FPGA comprises one or more of:
   a triptych architecture;
   a hybrid architecture; and
   a VF1 architecture.

12. The system of claim 10, wherein:
   the FPGA comprises more than one CLB, each CLB comprising one or more BLEs; and
   the CLBs in the FPGA comprise a determined placement of BLEs with respect to the CLBs that increases the sharing of SRAM tables by LUTs of the BLEs.

13. The system of claim 10, wherein:
   the FPGA comprises more than one CLB, each CLB comprising one or more BLEs; and
   the BLEs are synthesized from a logic design according to algorithm for increasing sharability of SRAM tables by LUTs of the BLEs.

14. A method for sharing a static random-access memory (SRAM) table between two or more lookup tables (LUTs) that are equivalent to each other, the method comprising:
   using at least two basic logic elements (BLEs) to provide at least two particular functions, each BLE being associated with a truth table representing the particular function provided by the BLE, the particular functions provided by the BLEs comprising equivalency to each other, each BLE comprising an LUT comprising the truth table associated with the BLE; and
   sharing an SRAM between the two or more LUTs of the two or more BLEs table to obviate the LUTs of the BLEs comprising SRAM tables separate from each other.

15. The method of claim 14, wherein the particular functions provided by the BLEs comprise one or more of:
   P equivalency to each other;
   NP equivalency to each other;
   PN equivalency to each other; and
   NPN equivalency to each other.

16. The method of claim 14, wherein each of the BLEs comprises, in addition to the LUT:
   a flip-flop; and
   a multiplexer for selecting output of the LUT or output of the flip-flop to provide output of the BLE.

17. The method of claim 14, wherein each of the LUTs comprises, in addition to the SRAM table, a multiplexer coupled to the SRAM table providing addressing logic according to the truth table representing the particular function of the BLE comprising the LUT and contents of the SRAM table.

18. The method of claim 17, wherein conditional negation (CN) logic at one or more of one or more control inputs to or one or more outputs from one or more of the multiplexers of the LUTs collectively realize the equivalency of the particular functions provided by the BLEs to each other.

19. The method of claim 18, wherein the CN logic is operable to disable or enable.

20. The method of claim 14, wherein the BLEs each have four inputs and one output.

21. The method of claim 14, wherein a configurable logic block (CLB) comprises the BLEs.

22. The method of claim 21, wherein:
   the CLB comprises more than two BLEs; and
   one or more of the BLEs in the CLB comprise LUTs that do not share an SRAM table.

23. The method of claim 21, wherein a field-programmable gate array (FPGA) comprises the CLB.

24. The method of claim 23, wherein the FPGA comprises one or more of:
   a triptych architecture;
   a hybrid architecture; and
   a VF1 architecture.

25. The method of claim 23, wherein:
   the FPGA comprises more than one CLB, each CLB comprising one or more BLEs; and
   the CLBs in the FPGA comprise a determined placement of BLEs with respect to the CLBs that increases the sharing of SRAM tables by LUTs of the BLEs.

26. The method of claim 23, wherein:
   the FPGA comprises more than one CLB, each CLB comprising one or more BLEs; and
   the BLEs are synthesized from a logic design according to algorithm for increasing sharability of SRAM tables by LUTs of the BLEs.

27. A system for a sharing static random-access memory (SRAM) table between two or more lookup tables (LUTs) that are equivalent to each other, the system comprising:
   means for using at least two basic logic elements (BLEs) to provide at least two particular functions, each BLE being associated with a truth table representing the particular function provided by the BLE, the particular functions provided by the BLEs comprising equivalency to each other, each BLE comprising an LUT comprising the truth table associated with the BLE; and
   means for sharing an SRAM between the two or more LUTs of the two or more BLEs table to obviate the LUTs of the BLEs comprising SRAM tables separate from each other.

\* \* \* \* \*